(12) United States Patent
Wang

(10) Patent No.: US 8,213,639 B2
(45) Date of Patent: Jul. 3, 2012

(54) SOUND AND LIGHT CONTROL APPARATUS

(76) Inventor: Chao-Lang Wang, Xizhi (TW)

( * ) Notice: Subject to any disclaimer, the term of this patent is extended or adjusted under 35 U.S.C. 154(b) by 283 days.

(21) Appl. No.: 12/654,728

(22) Filed: Dec. 30, 2009

(65) Prior Publication Data

US 2011/0091052 A1    Apr. 21, 2011

(30) Foreign Application Priority Data

Oct. 15, 2009  (TW) ................................ 98134906 A

(51) Int. Cl.
*H03G 3/00* (2006.01)
*H03G 5/00* (2006.01)
*G09F 27/00* (2006.01)
*G01D 11/28* (2006.01)
*F21V 33/00* (2006.01)
*H04M 1/22* (2006.01)

(52) U.S. Cl. .......... 381/109; 381/98; 381/124; 381/104; 362/23; 362/27; 362/85; 362/86

(58) Field of Classification Search .................. 381/124, 381/61–63, 102–109, 98; 362/23, 27, 85, 362/86
See application file for complete search history.

(56) References Cited

U.S. PATENT DOCUMENTS 6,445,369 B1 * 9/2002 Yang et al. ...................... 345/82

* cited by examiner

*Primary Examiner* — Devona Faulk
(74) *Attorney, Agent, or Firm* — Bacon & Thomas, PLLC

(57) ABSTRACT

A sound and light control apparatus includes an audio signal input terminal for receiving an audio signal, a voltage dividing circuit electrically connected to the audio signal input terminal for dividing the voltage of the audio signal into two divided voltages, a control knob electrically connected to the voltage dividing circuit for adjusting the divided voltages, at least one audio signal output terminal electrically connected to the voltage dividing circuit and at least one loudspeaker for transmitting one divided voltage to the loudspeaker, a frequency-divider crossover circuit electrically connected to the voltage dividing circuit for filtering the other divided voltage according to a plurality of different audio frequencies to generate corresponding frequency division voltages, and transmitting each frequency division voltage to a corresponding frequency division voltage output terminal electrically connected to a light emitting diode and enabling the light emitting diode to produce light corresponding to the frequency division voltage.

7 Claims, 3 Drawing Sheets

SOUND AND LIGHT CONTROL APPARATUS

FIELD OF THE INVENTION

The present invention relates to a control apparatus, in particular to a sound and light control apparatus connected to an audio amplifier, at least one loudspeaker and a plurality of light emitting diodes, such that after the sound and light control apparatus receives an audio signal transmitted from the audio amplifier, the audio signal can be transmitted to the loudspeaker, and processed by a frequency division process and then transmitted to the light emitting diodes, so that users can appreciate the visual effects of the light emitting diodes that blink along with the frequency of music while listening to the music.

BACKGROUND OF THE INVENTION

As our living standard improves, the concept of doing business has been changed gradually from the emphasis on making profits to satisfying people's spiritual needs and feelings, and the concept of leisure activities has implanted in our mind, and we would spend much time on leisure activities to relax ourselves and have fun after work. As the electronic industry advances, various different types of electronic components and manufacturing technologies have been developed successfully, and the manufacturing cost of electronic products is reduced significantly, and the functions and qualities of the electronic products are improved. Therefore, consumers start purchasing related electronic products to improve the quality and fun of the leisure activities and enjoy the leisure activities more.

For example, when listening to a music, many people like to assemble several sets of loudspeakers having different vocal ranges with a preamplifier and a power amplifier to perfectly show the performances of the fine tones of high, mid and low vocal frequencies in the music, so as to deeply feel every details of the rhythm of the music. However, people may easily feel monotonous and unmindful of the music while there is only the music being played in an environment for a long period of time. The aforementioned listening environment seems more suitable for only one person interested to enjoy the music alone. However, in an environment for a group of people in a party or other activities, music is often played together with a lighting effect to create a unique atmosphere for the environment, so as to let those people in the party or activities intensely feel or cannot help to immerse in the atmosphere created by the music and lighting effect. Up to the present, most existing lamps used in the party or activities for generating lighting effect are generally connected to an independent control circuit, such that the brightness and blinking effect of the lamps can only be controlled or adjusted manually by an operator according to a fixed program instructions (such as turning on, turning off, low speed blinking, mid speed blinking or high speed blinking, etc) designed in the control circuit. Therefore, every time when the style of the music played in the party or activity is changed (such as changing from classic music to rock and roll music), the host or operator of the party or activity has to make adjustments manually to the corresponding fixed status of the lighting effect, or else the music will be inharmonious with the lighting effect of the environment. As a result, people who joining the party or activity may lose their mood when the created atmosphere is ruined.

In addition, in some specific places (such as pubs and discos, etc) or specific activities (such as concerts), various types of music are generally played together with different lighting effects to fan up the participants' mood quickly. However, the hanging lamps installed in the aforementioned places or for the aforementioned activities are also connected to an independent control circuit, which can only be controlled manually by a disc jockey for adjusting the brightness and blinking effect of the lamps. When disc jockey is not in good condition or is inexperienced, the way of controlling and showing the lighting effect will be unable to match with the live music perfectly, or will easily ruin the participants' mood. Therefore, it is an important issue for light and sound manufacturers to develop a novel electronic product capable of adjusting the brightness and blinking effect of the lamps automatically to match with the rhythm and melody of the music, so as to create a harmonious light and sound effect for the performance as well as the live-performance scene.

SUMMARY OF THE INVENTION

In view of the importance of integrating music with lighting effects, the inventor of the present invention based on years of experience in the related industry to conduct extensive researches and experiments, and finally developed a sound and light control apparatus in accordance with the present invention to control brightness and blinking effect of a lamp according to melody of music automatically, so as to create brilliant visual and audio atmosphere.

Another objective of the present invention is to provide a sound and light control apparatus, which comprises a casing having a containing space therein for containing related circuits of the sound and light control apparatus, an audio signal input terminal disposed on the casing for receiving an audio signal transmitted from an audio amplifier; a voltage dividing circuit installed in the casing and electrically coupled with the audio signal input terminal for receiving the audio signal and dividing voltage of the audio signal into two divided voltages; a control knob installed on the casing and electrically coupled with the voltage dividing circuit, such that when the control knob is turned, an impedance of a voltage dividing resistor on the voltage dividing circuit is changed, and voltage values of the divided voltages are changed correspondingly; an audio signal output terminal installed on the casing and electrically coupled to the voltage dividing circuit and at least one loudspeaker for transmitting one divided voltage to the loudspeaker, such that the loudspeaker produces corresponding sound and sound volume according to the divided voltage; a frequency-divider crossover circuit installed in the casing and electrically coupled with the voltage dividing circuit for receiving the other divided voltage, filtering the other divided voltage according to different audio frequencies to generate corresponding frequency division voltages, and transmitting each frequency division voltage to a frequency division voltage output terminal, wherein each frequency division voltage output terminal is installed on the casing and electrically coupled to one light emitting diode for transmitting the frequency division voltage to the light emitting diode, such that the light emitting diode can generate lights according to the frequency division voltage. As a result, users can use the sound and light control apparatus to process the audio signal outputted from the audio amplifier and transmit the processed audio signal to the loudspeaker and the light emitting diodes, for enabling the light emitting diodes to generate lights according to the different frequencies of the audio signals to create a desired sound and light effect while the loudspeaker is playing music.

Another objective of the present invention is to supply different voltages to the loudspeaker and the light emitting diodes for generating sound and lights according to the audio signals outputted by the audio amplifier, so that the sound and light control apparatus requires no additional power supply at all, which not only simplifies the overall structure for producing sound and light effects according to music, but also avoids the troubles and problems of installing additional cables as while using the conventional sound and light control apparatus.

A further objective of the present invention is to provide a sound and light control apparatus further comprising an electronic switch and a switch, wherein the electronic switch is installed in the casing and coupled to the voltage dividing circuit, the audio signal output terminal and the frequency-divider crossover circuit for changing a conducting state of the electronic switch, such that the divided voltages can be transmitted to the audio signal output terminal and the frequency-divider crossover circuit respectively, or one of the divided voltages can be directly transmitted to the audio signal output terminal, and the switch is installed on the casing and electrically coupled to the electronic switch for controlling the conducting state of the electronic switch, so as to enable users to control the music and lighting effect according to the actual requirements.

DETAILED DESCRIPTION OF THE PREFERRED EMBODIMENTS

Figure 1:
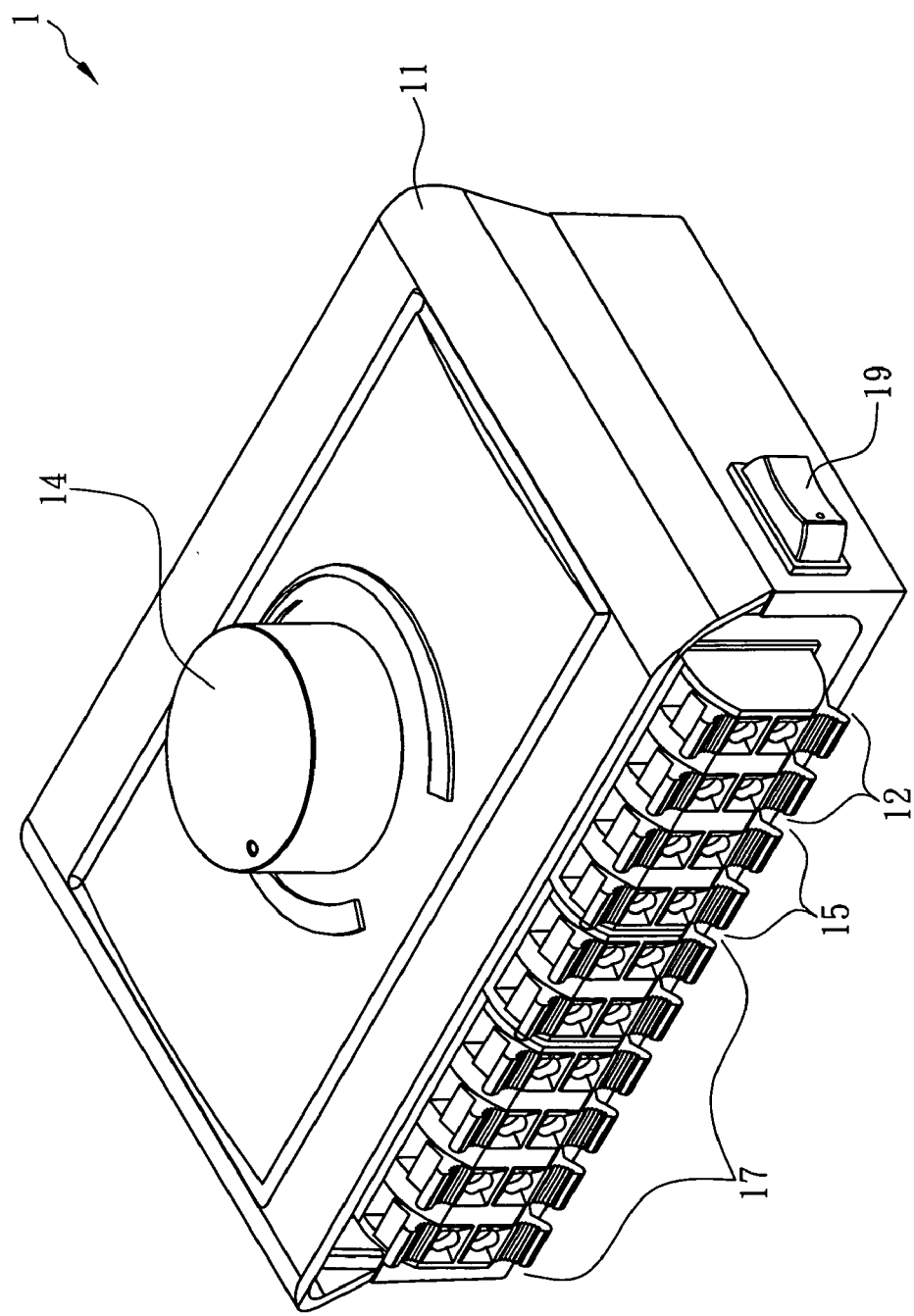
FIG. 1 is a perspective view of a sound and light control apparatus in accordance with the present invention.
Figure 2:
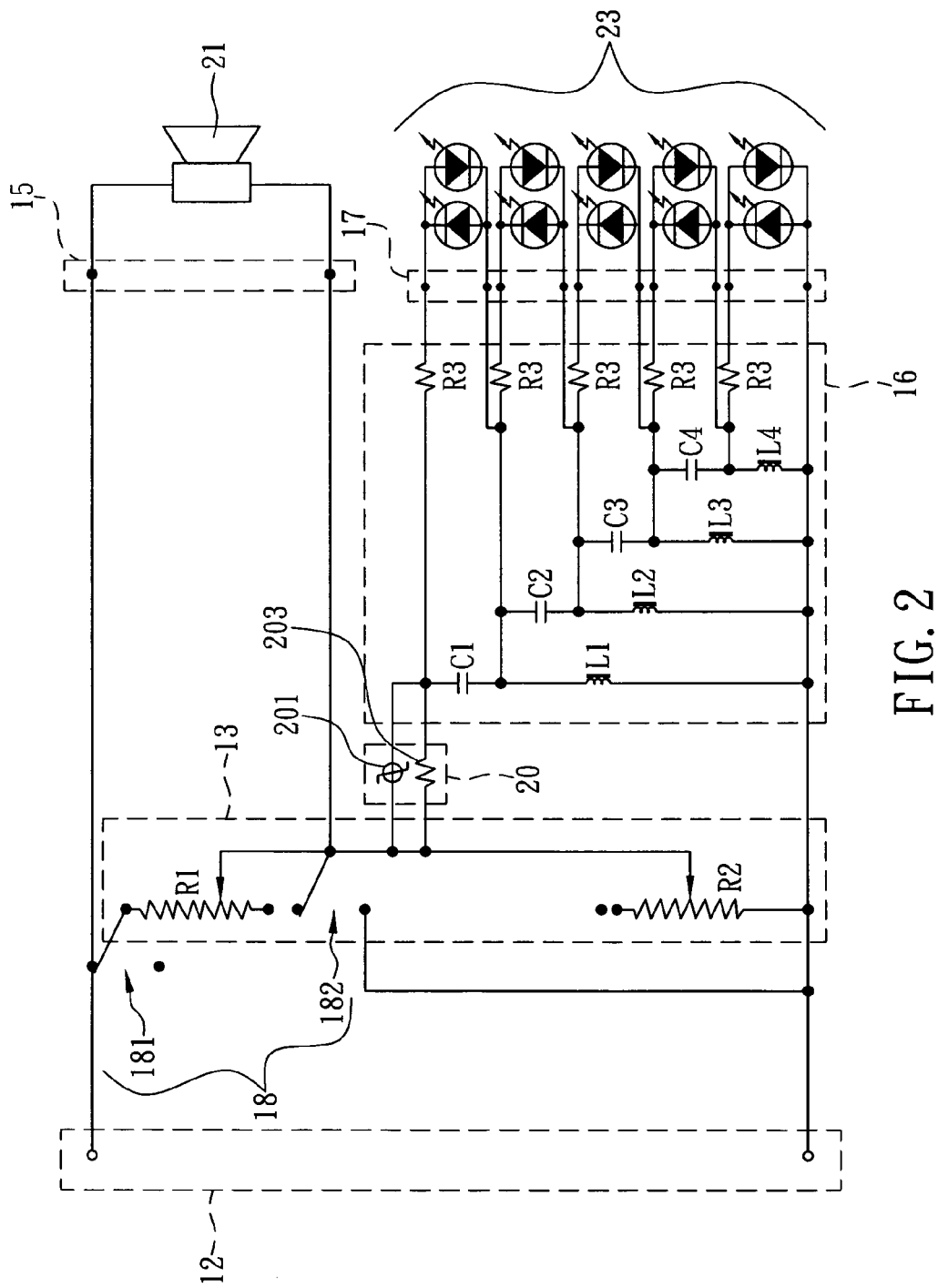
FIG. 2 is a schematic circuit diagram of a sound and light control apparatus in accordance with the present invention.

With reference to FIGS. 1 and 2, the present invention is to provide a sound and light control apparatus for creating an atmosphere with good sound and light effects, so as to enable users to appreciate the light blinking effects along with audio frequencies involved in a music while the users are listening to the music. In accordance with a preferred embodiment of the present invention, the sound and light control apparatus 1 comprises a casing 11, an audio signal input terminal 12, a voltage dividing circuit 13, a control knob 14, at least one audio signal output terminal 15, a frequency-divider crossover circuit 16, at least one frequency division voltage output terminal 17 (wherein the present invention is illustrated by a plurality of frequency division voltage output terminals 17 in this preferred embodiment), an electronic switch 18 and a switch 19, wherein the casing 11 includes a containing space (not shown in the figure) for accommodating related circuits of the sound and light control apparatus 1, and the casing 11 can be designed into any shape according to design requirements, and the shape as shown in FIG. 1 is used for an illustration only. The audio signal input terminal 12 is installed on the casing 11 and is coupled to an audio amplifier for receiving audio signals transmitted from the audio amplifier. In general, the audio signal is an electric signal converted and formed from an original sound wave by the audio amplifier. Thus, when the audio signal is again converted into a sound wave through the loudspeaker, the frequency of the sound wave is the same as the frequency of the original sound wave, and audio quality of the sound wave is the same of the original sound wave.

With reference to FIGS. 1 and 2, the voltage dividing circuit 13 is installed in the casing 11 and electrically coupled to the audio signal input terminal 12, for receiving the audio signal and dividing the voltage of the audio signal into two divided voltages, and the control knob 14 is installed on the casing 11 and electrically coupled to the voltage dividing circuit 13. When the control knob 14 is turned, an impedance of a voltage divided resistor installed on the voltage dividing circuit 13 is changed, and the divided voltages are changed correspondingly. The foregoing disclosed technical characteristics assume that the voltage of the audio signal is equal to V, and the resistor R1 at the top of the voltage dividing circuit 13 has a resistance equal to 8 ohms, and the resistor R2 at the bottom of the voltage dividing circuit 13 has a resistance equal to 40 ohms, such that when a user turns the control knob 14 to set the impedance of the voltage dividing circuit 13 to half, then the resistor R1 at the top will be equal to 4 ohms, and the resistor R2 at the bottom will be equal to 20 ohms, and thus the divided voltage of the resistor R1 is equal to ⅙ V, and the divided voltage of the resistor R2 is equal to ⅚ V, so that users can turn the control knob 14 to change the voltage values of the divided voltages if needed. In addition, the audio signal output terminal 15 is installed on the casing 11 and electrically coupled to the voltage dividing circuit 13 and at least one loudspeaker 21 for transmitting one divided voltage (which is obtained from the divided voltage of the resistor R1) to the loudspeaker 21, and the loudspeaker 21 converts the electric energy of the divided voltage into mechanical energy to push a membrane of the loudspeaker 21 to produce corresponding sound. In addition, the audio signal output terminal 15 is connected in parallel with the resistor R1 at the top, such that the larger the voltage value of the loudspeaker 21, the louder is the sound. In other words, the loudspeaker 21 can produce a sound with a corresponding volume according to the divided voltage.

With reference to FIGS. 1 and 2, the frequency-divider crossover circuit 16 is installed in the casing 11 and electrically coupled to the voltage dividing circuit 13 for receiving the other divided voltage, wherein the frequency-divider crossover circuit 16 is connected in parallel with the resistor R2 at the bottom in this preferred embodiment, and the sum of the voltage value received by the frequency-divider crossover circuit 16 and the voltage value received by the audio signal output terminal 15 is equal to the sum of voltage value of the audio signal received by the audio signal input terminal 12. In addition, the frequency-divider crossover circuit 16 includes four capacitors C1, C2, C3, C4 and four inducers L1, L2, L3, L4, wherein the capacitor C1 is connected in series with the inducer L1, and the capacitor C1 is electrically coupled to a terminal of the voltage dividing circuit 13, and the inducer L1 is electrically coupled to another terminal of the voltage dividing circuit 13, and the capacitor C2 and the inducer L2 are connected in series with each other, and the capacitor C2 and the inducer L2 are connected in parallel with the inducer L1, and the capacitor C3 and the inducer L3 are connected in series with each other, and the capacitor C3 and the inducer L3 are connected in parallel with the inducer L2, and the capacitor C4 and the inducer L4 are connected in parallel with each other, and the capacitor C4 and the inducer L4 are connected in parallel with the inducer L3 to form the frequency-divider crossover circuit 16 of the present invention. In addition, both terminals of the capacitors C1, C2, C3, C4 are electrically coupled with the corresponding frequency division voltage output terminals 17. In general, the capacitor has a high-pass property; in other words, an electric signal requires a higher frequency for passing through the capacitor, and the frequency for an electric signal passing through the capacitor depends on the capacitance of the capacitor. The inducer has a low-pass property, in other words, an electric signal requires a lower frequency for passing through the inducer, and the frequency for the electric signal to pass through the inducer depends on the induction of the inducer. In this preferred embodiment, the capacitances of the capacitors C1, C2, C3, C4 are descending sequentially, and the inductances of the inducers L1, L2, L3, L4 are also descending sequentially, so that the frequency-divider crossover circuit 16 can filter the other divided voltage according to a plurality of different audio frequencies to generate a plurality of corresponding frequency division voltages, as shown in FIG. 2, and the frequencies of the frequency division voltages of the corresponding capacitors C1, C2, C3, C4 are ascending from top to bottom sequentially, and the frequency division voltages are sent to the corresponding frequency division voltage output terminals 17 respectively, such that each frequency division voltage output terminal 17 can receive the frequency division voltage having frequencies within a certain range of audio frequencies. In FIG. 1, the frequency division voltage output terminals 17 are installed on the casing 11 and electrically coupled to at least one light emitting diode 23 for transmitting the frequency division voltage to the corresponding light emitting diode 23, such that the light emitting diodes 23 can produce lights according to different frequency division voltages, and the light emitting diodes 23 can blink along with the frequencies of the audio signals of the music to create a mixed sound and lighting effects for our audio-visual appreciation.

In FIGS. 1 and 2, a protection circuit 20 is electrically coupled between the frequency-divider crossover circuit 16 and the voltage dividing circuit 13 to prevent damages to the light emitting diode 23 and the capacitors C1, C2, C3, C4 or the inducers L1, L2, L3, L4 due to a surge current, wherein the protection circuit 20 includes a protection device 201 (such as a positive temperature coefficient thermistor) and a protection resistor 203, and the protection device 201 is connected in series with a terminal of the capacitor C1 of the frequency-divider crossover circuit 16 and connected in parallel with the protection resistor 203. When the current rises, the impedance of the protection device 201 will increase, and when the current drops, the impedance of the protection device 201 will decrease, so as to control the current passing from the protection device 201 or the protection resistor 203 to a terminal of the capacitor C1 of the frequency-divider crossover circuit 16. In addition, a resistor R3 is installed between the frequency-divider crossover circuit 16 and the frequency division voltage output terminals 17 for protecting the corresponding light emitting diodes 23, and enhancing the using life of the sound and light control apparatus 1.

In FIGS. 1 and 2, the electronic switch 18 is installed in the casing 11 and electrically coupled to the voltage dividing circuit 13, the audio signal output terminal 15 and the frequency-divider crossover circuit 16, and the switch 19 is installed on the casing 11 and electrically coupled to the electronic switch 18 for controlling a conducting state of the electronic switch 18. In this preferred embodiment, the electronic switch 18 includes two switch circuits 181, 182, and the switch circuits 181, 182 are operated simultaneously, such that when the switch circuits 181, 182 are switched upward for an electric connection, the audio signal inputted from the audio signal input terminal 12 can be transmitted to the audio signal output terminal 15 and the frequency-divider crossover circuit 16 for drive the loudspeaker 21 and the light emitting diodes 23 after the voltage division takes place respectively, such that while users are listening to the music, the light emitting diodes 23 will blink according to the frequencies of the audio signals of the music to provide a fancy light effect. When a user turns the control knob 14 to supply a lower voltage to the audio signal output terminal 15, the light emitting diodes 23 will obtain a higher voltage accordingly. Thus the smaller the sound of the loudspeaker 21, the brighter are the light emitting diodes 23, and vice versa. For example, when in daytime, lighting effect is meaningless and louder sound is bearable to people within the environment, users can adjust the loudspeaker 21 to a higher volume through the voltage dividing circuit 13 to reduce the brightness of the light emitting diode 23, or just play sound by the loudspeaker 21 only, so as to protect the light emitting diode 23 and prolong the use life of the light emitting diode 23. As to the voltage division effect, fine-tune adjustments can be made according to the user's personal preference. At nighttime, since the environment is quite and not suitable to have a high volume, so that, while listening to a music, the user can adjust the loudspeaker 21 to a lower volume, or mute the loudspeaker, through the voltage dividing circuit 13, so as to enhance the brightness of the light emitting diode 23 and enjoy the visual effect corresponding to rhythm of the music. In addition, when the switch circuits 181, 182 of the electronic switch 18 are switched downward for an electric conduction, the audio signal inputted from the audio signal input terminal 12 is transmitted to the audio signal output terminal 15 only, and the voltage dividing circuit 13 is equivalent to being disconnected. Meanwhile, only the loudspeaker 21 produces sound, and the light emitting diodes 23 will not produce lights, so that the user can selectively control the sound and light control apparatus 1 according to the actual needs.

Figure 3:
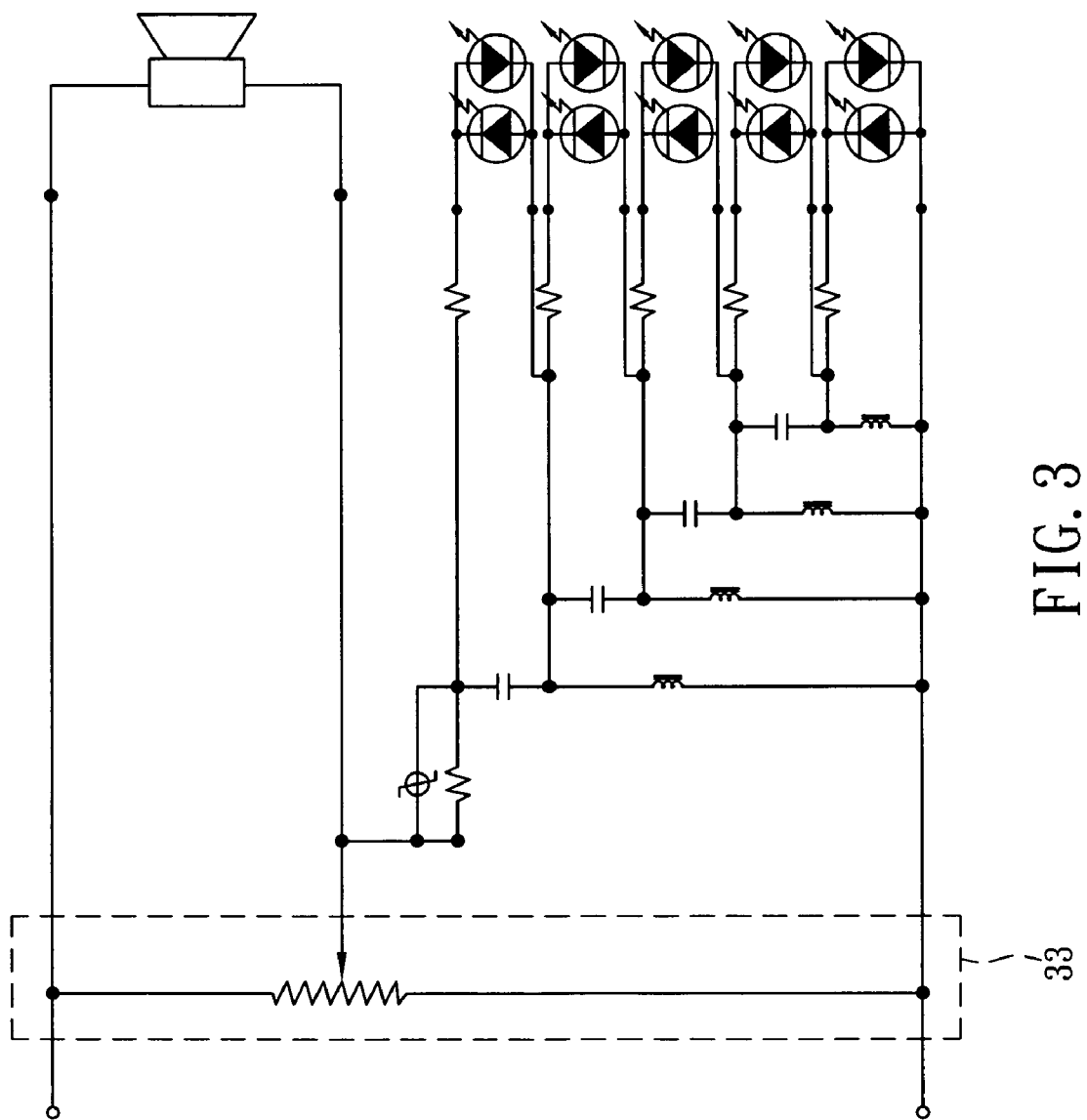
FIG. 3 is another schematic circuit diagram of a sound and light control apparatus in accordance with the present invention.

It is noteworthy to point out that the frequency-divider crossover circuit of the foregoing preferred embodiment is able to generate a plurality of frequency division voltages. However, in other preferred embodiments of the present invention, manufacturer can just provide a frequency-divider crossover circuit for producing a single frequency division voltage and use a single frequency division voltage output terminal according to the product requirement, so that a single light emitting diode can produce light according to the corresponding frequency division voltage. In FIG. 2, the voltage dividing circuit of this preferred embodiment adopts two variable resistors, but manufacturers may just use one variable resistor to design the voltage divider circuit 33 (as shown in FIG. 3), without installing an electronic switch, in other preferred embodiments of the present invention. Therefore, the voltage dividing circuit described in the present invention is not limited to the above mentioned, but also refers to those capable of dividing the voltage value of the audio signal into two divided voltages and supply the divided voltages to the loudspeaker via the audio signal output terminal and to the light emitting diodes via the frequency-divider crossover circuit respectively. Summing up the above, it is apparent that a user is able to easily use the sound and light control apparatus to process the audio signal received from the audio amplifier and transmit the processed signal to the loudspeaker and the light emitting diodes, so that when the user is listening to the music, the user is not only able to enjoy the sound of the music produced from the loudspeaker, but also the lighting effects produced by the light emitting diodes according to the different frequencies of the audio signals of the music. In the sound and light control apparatus of the present invention, since the divided voltage for producing sound from the loudspeaker and the frequency division voltage for producing light from each light emitting diode are all provided by the audio signals outputted from the audio amplifier, therefore the sound and light control apparatus of the present invention requires no external power supply, which not only simplifies the overall structure for producing sound and light effects according to music, but also avoids the trouble and problem of installing additional cables as while using the conventional sound and light control apparatus.

While the invention has been described by means of specific embodiments, numerous modifications and variations could be made thereto by those generally skilled in the art without departing from the scope and spirit of the invention set forth in the claims.

What is claimed is:

1. A sound and light control apparatus, comprising:
    a casing, having a containing space therein;
    an audio signal input terminal, disposed on the casing for receiving an audio signal transmitted from an audio amplifier;
    a voltage dividing circuit, installed in the casing and electrically coupled with the audio signal input terminal for receiving the audio signal and dividing the voltage of the audio signal into two divided voltages;
    a control knob, installed on the casing and electrically coupled with the voltage dividing circuit, such that when the control knob is turned, impedance of a voltage dividing resistor on the voltage dividing circuit is changed, and the divided voltages are changed correspondingly;
    at least one audio signal output terminal, installed on the casing and electrically coupled to the voltage dividing circuit and at least one loudspeaker for transmitting one divided voltage to the loudspeaker, such that the loudspeaker produces a sound and a sound volume according to the divided voltage transmitted to the loudspeaker;
    a frequency-divider crossover circuit, installed in the casing and electrically coupled with the voltage dividing circuit for receiving the other divided voltage transmitted to frequency-divider crossover circuit, and filtering the other divided voltage according to a plurality of different audio frequencies to generate corresponding frequency division voltages; and
    at least one frequency division voltage output terminal, installed on the casing and electrically coupled to the frequency-divider crossover circuit for transmitting the frequency division voltages to corresponding light emitting diodes, such that each light emitting diode generates a light corresponding to the frequency division voltage.

2. The sound and light control apparatus of claim 1, further comprising:
    an electronic switch, installed in the casing and electrically coupled to the voltage dividing circuit, the audio signal output terminal and the frequency-divider crossover circuit for transmitting the divided voltages to the audio signal output terminal and the frequency-divider crossover circuit correspondingly or only transmitting the divided voltage to the audio signal output terminal by means of changing a conducting state of the electronic switch; and
    a switch, installed on the casing and electrically coupled with the electronic switch for controlling the conducting state of the electronic switch.

3. The sound and light control apparatus of claim 2, further comprising a protection circuit electrically coupled between the frequency-divider crossover circuit and the voltage dividing circuit, wherein the protection circuit comprises a protection device and a protection resistor, and the protection device is connected in parallel with the protection resistor.

4. The sound and light control apparatus of claim 3, wherein the voltage dividing circuit keeps the sum of a voltage value of the audio signal output terminal and a voltage value of the frequency-divider crossover circuit equal to a voltage value of the audio signal received by the audio signal input terminal.

5. The sound and light control apparatus of claim 4, wherein the protection device is a positive temperature coefficient thermistor.

6. The sound and light control apparatus of claim 5, further comprising a resistor installed between the frequency-divider crossover circuit and each frequency division voltage output terminal.

7. The sound and light control apparatus of claim 6, wherein the voltage dividing circuit is a voltage divider.

* * * * *